United States Patent
Feurle et al.

(10) Patent No.: US 6,751,145 B2
(45) Date of Patent: Jun. 15, 2004

(54) VOLATILE SEMICONDUCTOR MEMORY AND MOBILE DEVICE

(75) Inventors: Robert Feurle, Neubiberg (DE); Dominique Savignac, Ismaning (DE)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 10/233,968

(22) Filed: Sep. 3, 2002

(65) Prior Publication Data

US 2003/0043674 A1 Mar. 6, 2003

(30) Foreign Application Priority Data

Aug. 31, 2001 (DE) .......................... 101 42 658

(51) Int. Cl.$^7$ ................................ G11C 7/00
(52) U.S. Cl. ................. 365/222; 365/230.03; 365/233; 365/96
(58) Field of Search ............................ 365/222, 230.03, 365/233, 96

(56) References Cited

U.S. PATENT DOCUMENTS

| 5,926,429 | A |   | 7/1999 | Saitoh et al. | |
| 6,075,739 | A | * | 6/2000 | Ihara ........................ | 365/222 |
| 6,487,136 | B2 | * | 11/2002 | Hidaka ...................... | 365/222 |

FOREIGN PATENT DOCUMENTS

EP        0 790 620 A2    8/1997

OTHER PUBLICATIONS

Oshawa, T. et al.: "Optimizing the DRAM Refresh Count for Merged DRAM/Logic LSIs", ACM, 1998, pp. 82–87.

* cited by examiner

Primary Examiner—Connie C. Yoha
(74) Attorney, Agent, or Firm—Laurence A. Greenberg; Werner H. Stemer; Ralph E. Locher

(57) ABSTRACT

The volatile semiconductor memory is constructed from a plurality of memory segments. The information stored in the memory cells must be regularly reconditioned. Here, the time interval after the expiry of which the memory contents of the memory cells are reconditioned is set individually for each memory segment using corresponding subcircuits. The subcircuits receive, in a cyclical sequence, a refresh instruction. The passing on of the refresh instruction to the respective memory segment is interrupted if the segment-specific refresh time has not yet expired. This method of driving is implemented very easily and in a space-saving and cost-effective way in terms of circuitry.

11 Claims, 2 Drawing Sheets

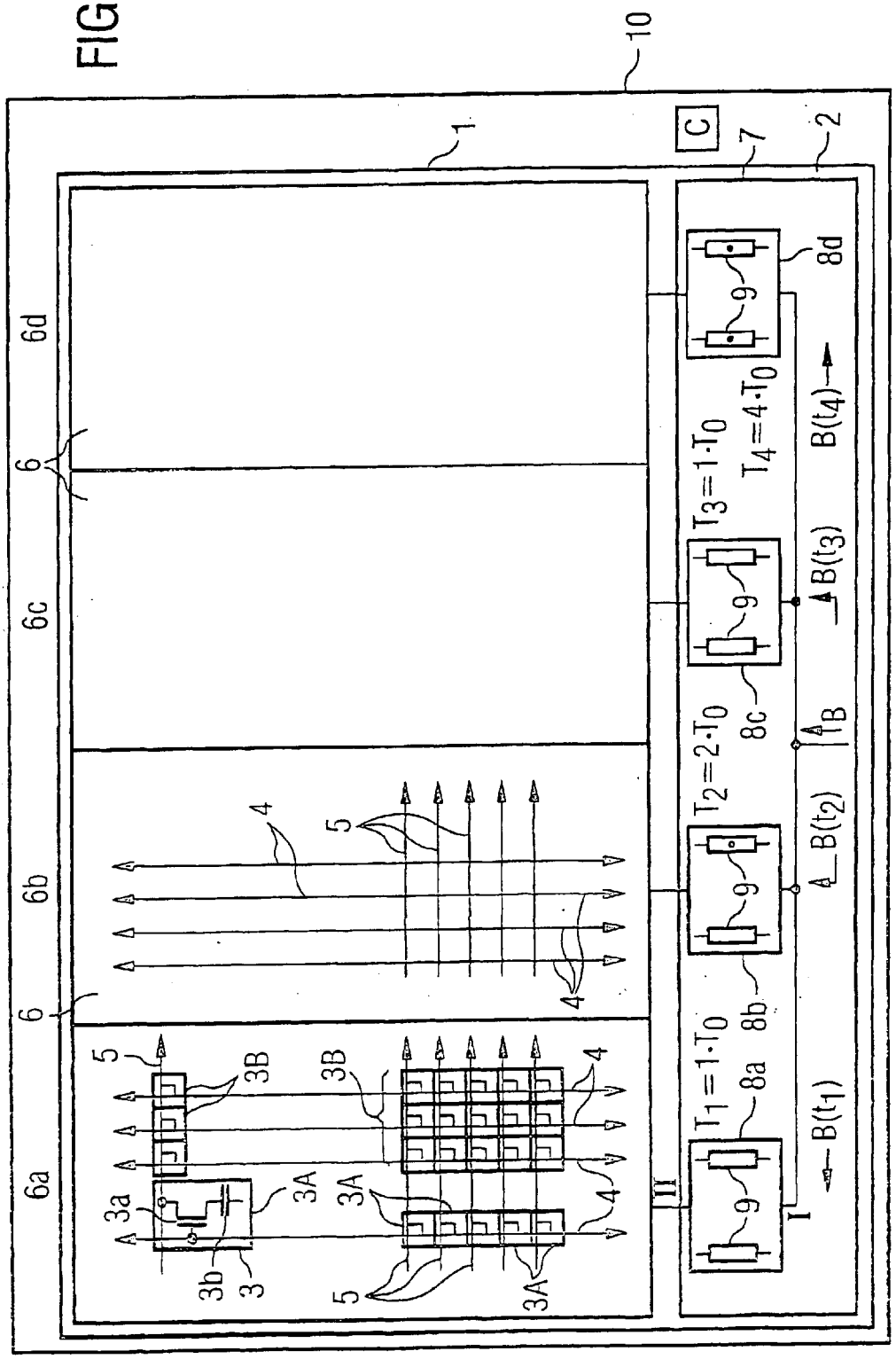

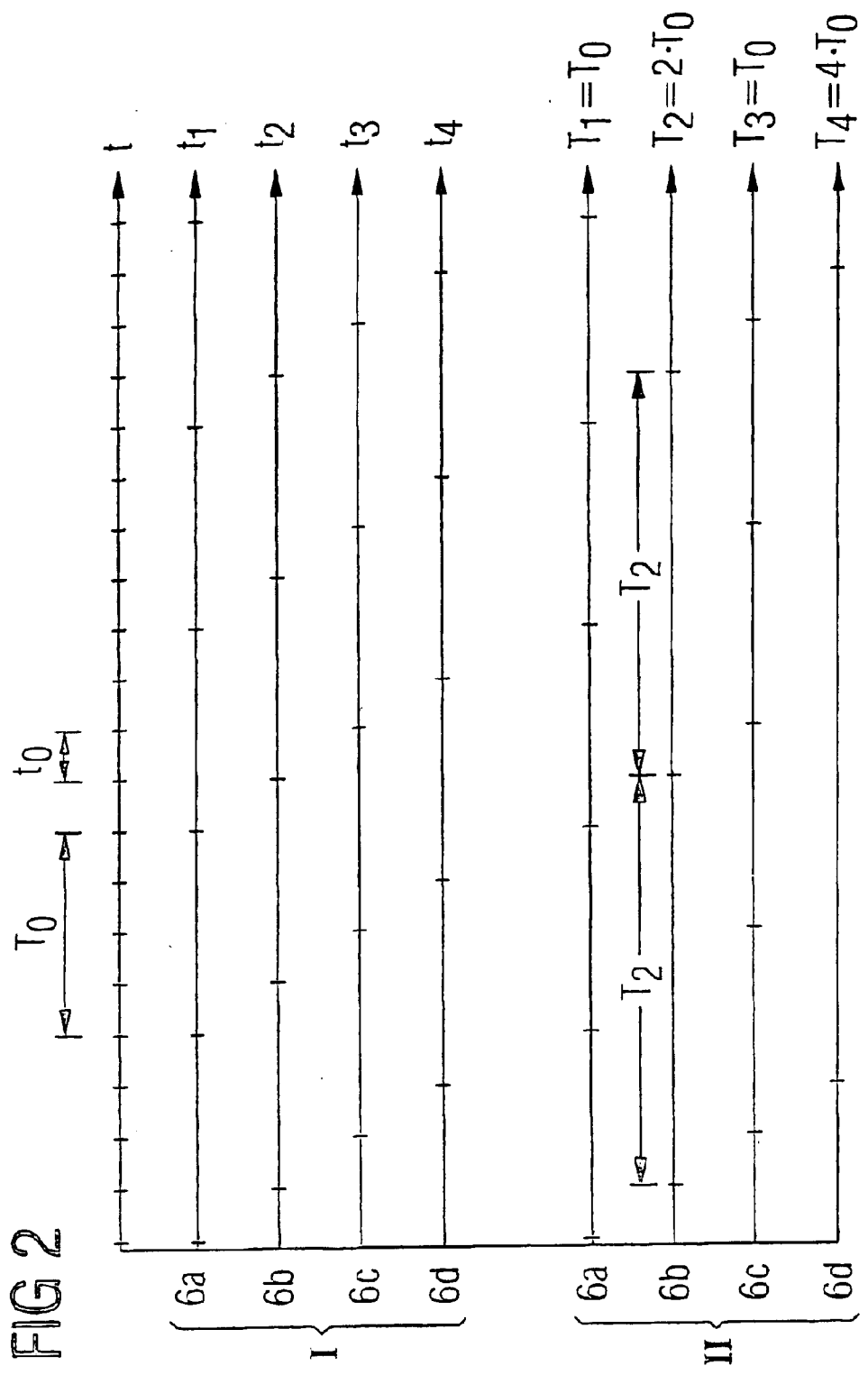

VOLATILE SEMICONDUCTOR MEMORY AND MOBILE DEVICE

BACKGROUND OF THE INVENTION

1. Field of the Invention:

The invention lies in the semiconductor technology field. More specifically, the invention relates to a volatile semiconductor memory having memory cells which are arranged on a semiconductor substrate and are connected to word lines and to bit lines which intersect the word lines. Further, the semiconductor memory is divided into a plurality of memory segments, and only memory cells, each of a single memory segment, are connected to each word line and to each bit line;

the semiconductor memory has a circuit by way of which it is possible to set the length of a time interval after the expiration of which the memory contents of memory cells are refreshed; and the circuit for each memory segment has a subcircuit which is assigned to this memory segment and by way of which a time interval which is specific to this memory segment, for the refreshing of the memory contents of this memory segment can be set.

Semiconductor memories, i.e. memory circuits which are manufactured by means of microelectronic semiconductor structures, can be divided into volatile and nonvolatile semiconductor memories. Volatile semiconductor memories require, for the storage of information, an external operating voltage which must be continuously maintained during the memory process if stored information is not to be lost. Such semiconductor memories, which are also referred to as random access memories (RAMs), are used, for example, as working memories in computers and other electronic devices. They permit information to be stored during use, i.e. while the computer or the electronic device is operating. When the operating voltage is switched off, information stored in a volatile semiconductor memory is lost.

On the other hand, nonvolatile semiconductor memories, in particular ROMs (read only memories), are used to store information over a relatively long time. Nonvolatile memories store information even if there is no external operating voltage present.

The volatile semiconductor memories considered here have, for the storage of information, integrated capacitors which are usually manufactured in trenches (deep trenches) which extend deep under the surface of a semiconductor substrate and store charge quantities over a limited time. A volatile semiconductor memory has a multiplicity of memory cells which are arranged on the semiconductor substrate and each have such a capacitor and at least one selection transistor each. In order to drive the memory cells electrically, word lines and bit lines which intersect the word lines are provided. Each memory cell is connected to a word line and to a bit line and can be driven by means of these lines. The selection transistors of the memory cells are connected by means of their electrodes to the word lines and bit lines.

If the selection transistor is, for example, a MOSFET (metal oxide semiconductor field effect transistor), the gate electrode is usually connected to a word line (first line) and a source/drain electrode to a bit line (second line). The remaining source/drain electrode is connected to a terminal of the capacitor. The selection transistor can be switched, and the capacitor thus charged or discharged, by means of suitable voltages at the word line and the bit line to which the memory cell is connected. As a result, information is stored or overwritten.

The various memory cells are arranged on the surface of the semiconductor substrate in the form of a grid, the word lines and the bit lines which are used to drive their memory cells electrically extending in the form of a network of intersecting lines. In this way, each memory cell can be driven, i.e. switched, using a word line and a bit line.

In volatile semiconductor memories, information can be stored only over a relatively short time period of the order of magnitude of milliseconds. The reason for this is leakage currents which occur in the memory circuit and as a result of which charges stored in the capacitors gradually flow away. In order to maintain the stored information, these charges must be refreshed. This is done by reading out the memory cells at short, regular intervals and overwriting them with the same information as before but with a higher signal strength. By means of this reconditioning, a larger charge quantity than before is written into those memory capacitors wherein charges are stored before such a refresh. The next refresh takes place before this charge quantity has disappeared due to leakage currents from the memory capacitor.

The recharging processes which are performed at short intervals in order to refresh stored information are carried out only while the volatile semiconductor memory is operating, i.e. for as long as the memory is supplied with its operating voltage. This leads to a certain consumption of power even if no new information is stored but rather only already stored information is being maintained. In order to keep the consumption of power low, particularly in mobile devices, efforts have been made to keep leakage currents as small as possible, and to make the time interval after the expiry of which the memory contents of the memory cells have to be refreshed as long as possible.

The time interval between successive refreshes is, however, upwardly limited owing to the speed at which memory capacitors become emptied. A certain fraction of the stored charge quantities must still be stored if a refresh is performed for the originally present storage charge to be still detected as such. If, on the other hand, a refresh of this information does not take place frequently enough, i.e. quickly enough, the reliability of the storage is lost.

The decay behavior of the storage charge and the duration of the storage vary from memory cell to memory cell. They are influenced by a multiplicity of manufacturing-conditioned fluctuations. Therefore, in practice each semiconductor memory is tested before being put into operation to determine the time interval for which information is still reliably stored between successive refreshes. A sufficiently short refresh interval is subsequently set. For this purpose, the semiconductor memory has a circuit by means of which the length of the time interval after the expiry of which the memory contents of the memory cells are refreshed, i.e. the length of the refresh interval, can be set.

The consumption of power which is brought about by the repeated conditioning of memory information is disadvantageous in a volatile semiconductor memory. Although the time period after which memory information is regularly reconditioned can be prolonged overall, this is however at the cost of the reliability of the storage. As the leakage currents and memory times which vary from cell to cell are mainly caused by statistical fabrication fluctuations, selective change of the reconditioning time is-possible only at the cost of the storage reliability. If a constant storage reliability is to be ensured, a specific minimum frequency of the reconditioning of the stored information is necessary.

However, this increases the consumption of power while the volatile semiconductor memory is operating.

It is known to provide circuits in order to set the reconditioning times on a memory-segment-specific basis. Such circuits have subcircuits which are assigned to the memory segments and with which the refresh times of the segments can be individually set. In this context, a plurality of identical subcircuits are set in accordance with the number of memory segments.

The multiple provision of identical subcircuits requires more chip area than necessary if each subcircuit brings about refreshing of the assigned memory segment with the segment-specific refresh time independently of the other subcircuits.

SUMMARY OF THE INVENTION

It is accordingly an object of the invention to provide a volatile semiconductor memory and a mobile device, which overcome the above-mentioned disadvantages of the heretofore-known devices and methods of this general type and which provide for a semiconductor memory wherein different segment-specific refresh times are implemented easily and in a space-saving and cost-effective way in terms of circuitry.

With the foregoing and other objects in view there is provided, in accordance with the invention, a volatile semiconductor memory, comprising:

a plurality of memory cells arranged on a semiconductor substrate and connected to word lines and to bit lines intersecting the word lines, the memory cells being disposed in a plurality of memory segments, and each word line and each bit line being respectively connected to memory cells of only a single memory segment;

a circuit connected to the memory cells for setting a time interval after an expiration of which the memory contents of the respective memory cells are to be refreshed;

the circuit having a subcircuit for each of the memory segments for specifically setting the time interval for each of the memory segments;

the subcircuits being connected on the semiconductor substrate such that the subcircuits receive an instruction to refresh the memory contents in a cyclical sequence, and such that a respective subcircuit, wherein a longer time interval is set for refreshing than in other the subcircuits, interrupts a passing on of the instruction to the memory segment assigned thereto, if the respective the subcircuit receives the instruction at a time when the longer time interval has not yet expired.

In other words, the above objects are achieved according to the invention in that the subcircuits which are assigned to the various memory segments are connected to the semiconductor substrate in such a way that, for the refreshing of the memory contents in a cyclical sequence, they receive an instruction for refreshing their memory contents, and that a subcircuit wherein a longer time interval is set for the refreshing than in other subcircuits interrupts the passing on of the instruction to the memory segment to which it is assigned, if it receives the instruction at a time at which the longer time interval has not yet expired.

When the time periods between successive refreshes vary on a segment-specific basis, the prompt refreshing of all the memory cells is carried out in a way which is very efficient, space-saving and cost-effective in terms of circuitry by virtue of the fact that the cyclical sequence of the addressing of the various segments which is customary in conventional multisegment memories is maintained, but the subcircuits which monitor the expiry of the segment-specific refresh times prevent the instruction to refresh if the refresh interval which is provided for the respective memory segment has not yet expired. Thus, for example in a memory segment which is assigned a refresh interval between successive refreshes which is twice as long, the instruction to refresh which is received from the subcircuit is passed on to the memory segment only every second time. Each other time, the passing on of this instruction to the memory segment is interrupted. Refresh times which vary on a segment-specific basis can be implemented in a way which is very easy and space-saving, and therefore cost-effective in terms of circuitry by cyclically addressing the memory segments and by the interruption, performed where necessary, of the passing on of the cyclically generated refresh instructions.

In accordance with an added feature of the invention, each of the subcircuits which is assigned to a memory segment has at least one integrated fuse, the melting through of which changes the time interval for the refresh of the memory contents of this memory segment. The fuses which are conventionally used for the overall setting of the refresh interval of the memory can thus be assigned to subunits, in particular segments of the memory. The fuses which set the refresh intervals on a segment basis can together form the circuit present in conventional memories for setting the refresh intervals. However, they can also be provided in subcircuits which are spatially delimited on the substrate surface and which are also arranged in the spatial vicinity of the memory segment whose refresh interval they set.

In accordance with an additional feature of the invention, each of the subcircuits which is assigned to a memory segment has at least two integrated fuses with which at least four different time intervals for the refreshing of the memory contents of this memory segment can be set. Depending on how many and which, of these fuses are melted through, it is possible to set $2^N$ different time intervals given N fuses per segment.

In accordance with another feature of the invention, the subcircuits are constructed in such a way that a predefined minimum time interval or an integral multiple thereof can be set as a time interval for the refreshing of the memory contents. By setting a basic frequency or an integral divider of this basic frequency for the refreshing of memory information it is possible to drive the memory segments to refresh in a cyclical sequence, it being possible to simply skip memory segments whose memory contents do not need to be refreshed at a particular time. Thanks to the simple divisor ratio of different refresh intervals to one another it is possible to drive the various memory segments cyclically.

In accordance with a further feature of the invention, the subcircuits are constructed in such a way that when all the fuses in a subcircuit are conductive, the predefined minimum time interval is set as a time interval for the refreshing of the memory contents of the memory segment to which the subcircuit is assigned. If—in the case of two fuses per memory segment, for example—both fuses are melted through, the longest possible refresh interval is set, whereas if none of these fuses has melted through, i.e. all the fuses are electrically conductive, a shortest refresh interval, smaller by a factor of four, is set. In this embodiment, relatively long refresh intervals which are an integral multiple of a predefined minimum refresh interval, can be set by counting clock pulses in the assigned subcircuits, the fuses being integrated into the lines wherein the clock signals are passed on. The failure of a fuse thus leads to lines with melted-through fuses not counting any clock pulses, i.e. the clock counting proceeds more slowly overall. As a result, relatively long refresh intervals which are an integral multiple of a basic interval can easily be set.

The integrated fuses can be embodied as laser fuses or else as electrically meltable fuses. Both types of fuses are known, but conventionally only used overall to set the refresh interval of a semiconductor memory.

In accordance with a preferred feature of the invention, the semiconductor memory is divided into a plurality of memory segments in such a way that all the memory cells which are connected to the same word line form a single memory segment, together with each other memory cell which is connected to the same bit line as one of these memory cells.

Semiconductor memories are usually divided into a plurality of memory segments which each comprise equally large quantities of memory cells. In each memory segment it is possible to drive any desired memory cell by means of in each case one word line and one bit line. The network of the intersecting word lines and bit lines to which the memory cells are connected is determined here by the magnitude of the memory segment. All the memory cells which are connected to one and the same word line form a memory segment, together with any other memory cell which is connected to the same bit line as one of these memory cells. Likewise, all the memory cells which are connected to this bit line form the same memory segment, together with any other memory cell which is connected to the same word line as one of these memory cells. However, none of the word lines or bit lines to which one of these memory cells is connected leads to a memory cell of another memory segment; in each memory segment, the memory cells are connected to one other set of word lines and bit lines.

A memory segment is thus that unit of the semiconductor memory which is formed by an individual network with the selection transistors of memory cells of connected word lines and bit lines. Contemporary semiconductor memories have a plurality of memory segments which can be operated independently of one another and whose memory cells can be driven by means of different groups of word lines and bit lines.

In a preferred embodiment of the invention, the semiconductor memory is a DRAM which has a memory-internal clock time transmitter. Such a memory module, which is also referred to as a SDRAM (synchronous dynamic random access memory), is an example of a volatile memory which is operated with a particularly low power consumption using the present invention.

According to the invention, a mobile device of the type designated at the beginning is also made available, which is distinguished in that the semiconductor memory of the mobile device is constructed in accordance with one of the abovementioned embodiments. In particular, mobile telephones consume less current during their operation with a semiconductor memory which is constructed according to the invention and can be operated over a longer time than previously when they are disconnected from an external power supply.

Other features which are considered as characteristic for the invention are set forth in the appended claims.

Although the invention is illustrated and described herein as embodied in a volatile semiconductor memory and mobile device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic view of a mobile device with a semiconductor memory according to the invention; and FIG. 2 is a timing diagram showing a chronological sequence of the refreshing of the memory contents of a plurality of segments of the semiconductor memory according to the invention.

DESCRIPTION OF THE PREFERRED EMBODIMENTS

Referring now to the figures of the drawing in detail and first, particularly, to FIG. 1 thereof, there is shown a semiconductor memory 1 with a semiconductor substrate 2 on whose surface four memory segments 6a, 6b, 6c, 6d are arranged. Each of these memory segments 6a, 6b, 6c, 6d is composed of a multiplicity of word lines 4 and bit lines 5 which intersect one another. In the vicinity of the points of intersection, memory cells 3 are arranged, one of which is illustrated by way of representation of the others, with an overproportional size in order to present their internal structure. The memory cell 3 is composed of a selection transistor 3a which is connected to a word line 4 by its gate electrode, and to a bit line 5 by that source/drain electrode which is not connected to the storage capacitor 3b of this memory cell. All the memory cells 3A which are connected to the same word line 4 form a single memory segment 6a, together with any other memory cell 3B which is connected to the same bit line 5 as one of these memory cells 3A. Therefore, individual word lines 4 or bit lines 5 never extend beyond the limit between different memory segments 6a, 6b, 6c, 6d. As a result, the semiconductor memory 1 is divided into subunits, specifically memory segments 6a, 6b, 6c, 6d. The semiconductor memory 1 has a circuit 7 for setting the length of a time interval T, after the expiry of which the memory contents of the memory cells 3, 3A, 3B are refreshed. According to the invention, this circuit 7 is divided into subcircuits 8a, 8b, 8c, 8d, each of which is assigned to a memory segment 6a, 6b, 6c, 6d, the specific time interval $T_n$ of which for the refreshing of the memory contents is set by the circuit 7. Each subcircuit 8a, 8b, 8c, 8d has in each case two fuses 9 which can be melted through once before the semiconductor memory is put into operation, in order to set different, segment-specific refresh intervals between successive refresh processes.

In the semiconductor memory illustrated in FIG. 1, refresh intervals $T_1, T_3$, which correspond at the same time to a predefined time interval $T_0$, are set in the memory segments 6a and 6c. In the memory segment 6b, a refresh interval $T_2$ which is twice as long, and in the memory segment 6d a refresh interval $T_4$ which is four times as long is set. For the purpose of setting these refresh intervals, corresponding fuses 9 of the associated subcircuits 8a, 8b, 8c, 8d are melted through. As a result, a power-consuming refresh of the memory charges is carried out in the memory segments 6b, 6d less frequently than in the other memory segments 6a, 6c.

In a semiconductor memory 1 with four segments 6a, 6b, 6c, 6d which permit different refresh intervals which are set on a segment basis owing to statistical manufacturing fluctuations, the shortest of these refresh intervals is conventionally set for all the memory segments, which increases the consumption of power. In contrast, in the semiconductor memory according to the invention, the longest possible time interval which is still permitted for an acceptable storage in a particular memory segment is set for each memory segment.

FIG. 2 shows, for the semiconductor memory according to the invention, the chronological sequence of the times at which a refresh of the memory information is performed in the memory segments 6a, 6b, 6c, 6d. The top timescale t shows an equidistant sequence of those times at which any memory segment is refreshed. As the semiconductor memory 1 illustrated in FIG. 1 has precisely four memory segments 6a, 6b, 6c, 6d, the time period $T_0$ after which a refresh of the contents of a specific memory segment 6a; 6b; 6c; 6d is possible at the earliest is four times as long as the chronological difference to between any two successive refreshes.

As indicated in FIG. 1, an instruction B to refresh memory contents is transmitted in a cyclical sequence via a branching line to the four subcircuits 8a, 8b, 8c, 8d which are assigned to the respective segments 6a, 6b, 6c, 6d. The chronological sequence of those times $t_1$, $t_2$, $t_3$, $t_4$ at which this instruction reaches the individual subcircuits 8a, 8b, 8c, 8d is illustrated in FIG. 2 under I. When this instruction B is passed on by the subcircuits 8a, 8b, 8c, 8d to the memory segments 6a, 6b, 6c and 6d is illustrated on the time axes $T_1$, $T_2$, $T_3$ and $T_4$.

In accordance with a predefined cyclical sequence, each memory segment 6a, 6b, 6c, 6d is conditioned with the same refresh interval $T_0$ if the assigned subcircuit 8a; 8b; 8c; 8d does not prevent the refresh. The subcircuits 8a, 8b, 8c, 8d, whose fuses 9 can be used to set different refresh intervals $T_n$, cause the memory segments 6b, 6d to be subjected to a refresh less frequently than the other memory segments 6a, 6c. As, as illustrated in FIG. 1, one of the two fuses 9 of the subcircuit 8b has melted through, a refresh interval $T_2=2\times T_0$ which is twice as long is set for the segment 6b. This leads to a situation wherein, as illustrated in FIG. 2, the passing on of the refresh instruction B in the subcircuit 8b is interrupted every second time.

As is illustrated by the timescale $T_2$, shown in the group II, for the memory segment 6b, the passing on of the refresh instruction B to the memory region 6b is prevented by the subcircuit 8b of this memory segment 6b whenever only half of the refresh interval $T_2$ has expired. In a corresponding way, the subcircuit 8d of the memory segment 6d reduces the refresh frequency of this memory segment 6d by a factor of four, as is represented by the timescale $T_4$ of the memory segment 6d in FIG. 2.

After fabrication of the semiconductor memory 1, the fuses 9 can be melted through once after the testing of the refresh frequency which is necessary for each memory segment 6a, 6b, 6c, 6d, the selection of the fuses 9 which are to be melted through bringing about the respective setting of the segment-specific refresh intervals $T_1$, $T_2$, $T_3$ and $T_4$.

The present invention can be used to operate DRAMs, in particular SDRAMs (synchronous dynamic random access memories), i.e. DRAMs with a memory-internal clock time transmitter C, in a way which is economical in terms of power, and thus cost-effective. In particular, a mobile device 10 such as a mobile telephone can be used over a longer time without an external operating voltage.

We claim:
1. A volatile semiconductor memory, comprising:
a plurality of memory cells arranged on a semiconductor substrate and connected to word lines and to bit lines intersecting said word lines, said memory cells being disposed in a plurality of memory segments, and each word line and each bit line being respectively connected to memory cells of only a single memory segment;
a circuit connected to said memory cells for setting a time interval after an expiry of which memory contents of respective memory cells are to be refreshed;
said circuit having a subcircuit for each of said memory segments for specifically setting the time interval for each of said memory segments;
said subcircuits being connected on said semiconductor substrate such that said subcircuits receive an instruction to refresh the memory contents in a cyclical sequence, and such that a respective said subcircuit wherein a longer time interval is set for refreshing than in other said subcircuits interrupts a passing on of the instruction to the memory segment assigned thereto, if the respective said subcircuit receives the instruction at a time when the longer time interval has not yet expired.

2. The semiconductor memory according to claim 1, wherein each of said subcircuits assigned to a memory segment has at least one integrated fuse connected such that the time interval for refreshing the memory contents of the memory segment is changed when the fuse has melted through.

3. The semiconductor memory according to claim 2, wherein each of said subcircuits assigned to a memory segment has at least two integrated fuses for setting at least four different time intervals for refreshing the memory contents of the memory segment.

4. The semiconductor memory according to claim 1, wherein said subcircuits are constructed such that a predefined minimum time interval or an integral multiple thereof can be set as a time interval for refreshing the memory contents.

5. The semiconductor memory according to claim 4, wherein said subcircuits are constructed such that when all the fuses in a subcircuit are conductive, the predefined minimum time interval is set as a time interval for the refreshing of the memory contents of the memory segment to which the subcircuit is assigned.

6. The semiconductor memory according to claim 2, wherein said at least one integrated fuse is a laser fuse.

7. The semiconductor memory according to claim 1, wherein said at least one integrated fuse is an electrically meltable fuse.

8. The semiconductor memory according to claim 1, wherein the semiconductor memory is divided into the plurality of memory segments such that all said memory cells connected to a same word line form a single memory segment, together with each other memory cell connected to a same bit line as one of said memory cells.

9. The semiconductor memory according to claim 1 configured as a DRAM and comprising a memory-internal clock time transmitter.

10. A mobile device, comprising a volatile semiconductor memory according to claim 1.

11. The mobile device according to claim 10, wherein the mobile device is a mobile telephone.

* * * * *